United States Patent
Sohn et al.

(10) Patent No.: US 7,099,207 B2
(45) Date of Patent: Aug. 29, 2006

(54) SEMICONDUCTOR MEMORY DEVICE AND METHOD FOR MASKING PREDETERMINED AREA OF MEMORY CELL ARRAY DURING WRITE OPERATION

(75) Inventors: Han-Gu Sohn, Suwon-si (KR); Sei-Jin Kim, Seongnam-si (KR)

(73) Assignee: Samsung Electronics, Co., Ltd., Suwon-si ( * ) Notice: Subject to any disclaimer, the term of this patent is extended or adjusted under 35 U.S.C. 154(b) by 0 days.

(21) Appl. No.: 11/104,072

(22) Filed: Apr. 12, 2005

(65) Prior Publication Data

US 2005/0248983 A1   Nov. 10, 2005

(30) Foreign Application Priority Data

May 4, 2004   (KR) ............... 10-2004-0031350

(51) Int. Cl.
*G11C 7/00* (2006.01)
(52) U.S. Cl. .................. 365/195; 365/193
(58) Field of Classification Search ............ 365/195, 365/193
See application file for complete search history.

(56) References Cited

U.S. PATENT DOCUMENTS

| | | | |
|---|---|---|---|
| 5,594,704 A * | 1/1997 | Konishi et al. ............. 365/233 |
| 5,668,760 A | 9/1997 | Hazen | |
| 5,673,222 A | 9/1997 | Fukumoto et al. | |
| 5,912,849 A | 6/1999 | Yasu et al. | |
| 6,643,189 B1 * | 11/2003 | Kimura et al. ......... 365/189.04 |
| 6,954,384 B1 * | 10/2005 | Taruishi et al. ......... 365/189.05 |
| 6,999,350 B1 * | 2/2006 | Matsubara et al. .... 365/185.33 |
| 2001/0002886 A1 * | 6/2001 | Ooishi ....................... 365/196 |
| 2003/0031082 A1 * | 2/2003 | Sawada ...................... 365/233 |

FOREIGN PATENT DOCUMENTS

KR       100309463       9/2001

OTHER PUBLICATIONS

English Abstract***.

* cited by examiner

*Primary Examiner*—Michael T. Tran
(74) *Attorney, Agent, or Firm*—F. Chau & Associates, LLC

(57) ABSTRACT

A semiconductor device includes a memory cell array, including at least one of a plurality of memory cells storing program data received from a flash memory, a row address buffer, which receives a row address signal in response to a first strobe signal, and a column address buffer, which receives a column address signal in response to a second strobe signal. The device further includes a write protection circuit, enabled/disabled in response to a first control signal, the write protection circuit outputting a masking control signal in response to the row address signal, the second strobe signal, and second control signals when enabled, and a column decoder, which decodes the column address signal in response to the masking control signal and enables at least one of a plurality of column selection lines of the memory cell array, corresponding to the decoded column address signal, or disables the column selection lines.

17 Claims, 5 Drawing Sheets

SEMICONDUCTOR MEMORY DEVICE AND METHOD FOR MASKING PREDETERMINED AREA OF MEMORY CELL ARRAY DURING WRITE OPERATION

This application claims priority to Korean Patent Application No. 2004-31350, filed on May 4, 2004, in the Korean Intellectual Property Office, the disclosure of which is herein incorporated by reference in its entirety.

BACKGROUND OF THE INVENTION

1. Technical Field

The present invention relates to a semiconductor memory device, and more particularly, to a semiconductor memory device used in a mobile device.

2. Discussion of Related Art

Due to increases in the demand for mobile devices, such as cellular phones, efforts have been made to develop mobile products with a variety of functions. Mobile devices having larger data storage capacities and higher operating speeds are needed to support these functions. For example, a cellular phone that supports moving images and photographing functions may need a memory with a large storage capacity, such as a dynamic random access memory (DRAM), to store large amounts of data.

A cellular phone may include a memory with a small storage capacity, such as a flash memory, to store operating system (OS) programs and application programs, which support the functions. There are different types of flash memories, e.g., a NOR-type flash memory, an AND-type flash memory, and a NAND-type flash memory. The NOR-type flash memory, the AND-type flash memory, and the NAND-type flash memory may be differentiated from one another according to respective memory cell array structures. The NOR-type flash memory includes a NOR-type memory cell array that has reduced parasitic resistance, compared to the AND-type and NAND-type flash memories. Thus, the NOR-type flash memory can operate faster than the AND-type and NAND-type flash memories. However, the NOR-type flash memory occupies a larger area and is more expensive than the AND-type and NAND-type flash memories. The AND-type flash memory includes an AND-type memory cell array, and the NAND-type flash memory includes a NAND-type memory cell array. The AND-type and NAND-type memory cell arrays occupy less area per memory cell compared to the NOR-type flash memory. Thus, the AND-type and NAND-type memory cell arrays may be produced having a higher density than the NOR-type memory cell array. Therefore, the AND-type and NAND-type flash memories may occupy a smaller area and are cheaper than the NOR-type flash memory. However, the AND-type and NAND-type flash memories operate slower than the NOR-type flash memory.

The NOR-type flash memory was widely adopted in a cellular phone for high-speed operations of the cellular phone. However, the NAND-type flash memory has been more widely adopted in a cellular phone than the NOR-type flash memory because the NAND-type flash memory is cheaper than the NOR-type flash memory. To overcome the limitations of the NAND-type flash memory, e.g., slower operation, a predetermined program stored in the NAND-type flash memory may be copied into a memory with a large storage capacity, such as a DRAM, which can operate at a higher speed than the NAND-type flash memory, and a processor may be enabled to access the DRAM to execute the predetermined program. This technique is disclosed in U.S. Pat. No. 6,587,393 entitled "Semiconductor Device Including Multi-chip".

FIG. 1 is a block diagram of a system having a DRAM 20. Referring to FIG. 1, a central processing unit (CPU) 12, the DRAM 20, a direct memory access (DMA) 13, and a flash memory 14 are connected to one another via a memory bus 11. The DMA 13 is connected between the conventional DRAM 20 and the flash memory 14. To execute a predetermined program, an operating system (OS) program and application programs stored in the flash memory 14 are transferred to the DRAM 20 via the DMA 13 and stored in a predetermined area of the DRAM 20. The OS program and application programs stored in the flash memory 14 are copied into the DRAM 20. Thereafter, the CPU 12 accesses the DRAM 20, which operates at high speed, to execute the predetermined program.

FIG. 2 is a block diagram of the DRAM 20 of FIG. 1. Referring to FIG. 2, the DRAM 20 includes a row address buffer 21, a column address buffer 22, a row decoder 23, a column decoder 24, and a memory cell array 27. The memory cell array 27 has a predetermined area 28 for storing the OS program and application programs received from the flash memory 14. However, if a wrong address signal is input to the DRAM 20 due to, for example, program errors or a malfunction of a chipset during a write operation, wrong data may be written on the predetermined area 28. As a result, a system including the DRAM 20 may malfunction. In addition, it may be difficult to detect such wrong data written on the predetermined area 28.

SUMMARY OF THE INVENTION

According to an embodiment of the present disclosure, a semiconductor memory device includes a memory cell array, which comprises a plurality of memory cells, at least one of the plurality of memory cells storing program data received from a memory, a row address buffer, which receives a row address signal via an address pin in response to a first strobe signal, and a column address buffer, which receives a column address signal via the address pin in response to a second strobe signal. The semiconductor memory device further includes a write protection circuit, which is enabled or disabled in response to a first control signal, the write protection circuit, when enabled, outputting a masking control signal in response to the row address signal, the second strobe signal, and second control signals, and a column decoder, which decodes the column address signal in response to the masking control signal and then enables some of a plurality of column selection lines of the memory cell array corresponding to the decoded column address signal, or disables all of the column selection lines of the memory cell array.

The write protection circuit stores a reference address signal received via the address pin when it receives the first control signal having a first setting value, and compares the row address signal with the reference address signal stored therein and outputs the masking control signal in response to a comparison result, the second strobe signal, and the second control signals when it receives the first control signal having a second setting value.

The write protection circuit enables the masking control signal when the second control signals are enabled and the row address signal and the reference address signal correspond to a same address, and disables the masking control signal when the second control signals are disabled and the row address and the reference address signal correspond to different addresses.

The column decoder decodes the column address signal and enables at least one of the column selection lines corresponding to the decoded column address signal when the masking control signal is disabled, and disables all of the column selection lines when the masking control signal is enabled.

The semiconductor memory device further comprises a row decoder, which decodes the row address signal and activates at least one of a plurality of wordlines of the memory cell array corresponding to the decoded row address signal, wherein the first control signal is an extended mode register set (EMRS) signal.

The second control signals are an inverted chip selection signal, and an inverted signal of the chip selection signal and an inverted signal of the write enable signal.

The reference address signal comprises reference addresses and reference bank addresses, and the row address signal comprises row addresses and bank addresses. The write protection circuit comprises a control register, which is set to a predetermined value in response to the first control signal and outputs first and second register control signals according to the predetermined value, first registers, which respectively store the reference addresses in response to the first register control signal and output the reference addresses in response to the second register control signal, and second registers, which respectively store the reference bank addresses in response to the first register control signal and output the reference bank addresses in response to the second register control signal. The write protection circuit further comprising first comparators, which respectively compare the reference addresses received from the first registers with the row addresses and output first comparison signals as comparison results, second comparators, which respectively compare the reference bank addresses received from the second registers with the bank addresses and output second comparison signals as comparison results, and a logic circuit, which outputs the masking control signal in response to the first and second comparison signals and the second control signals. The control register enables the first register control signal when it is set to the first setting value in response to the first control signal, enables the second register control signal when it is set to the second setting value in response to the first control signal, and disables both of the first and second register control signals when it is set to the third setting value in response to the first control signal. The first and second registers are disabled when the first and second register control signals are disabled. The first comparators respectively enable the first comparison signals when the reference addresses are the same as the row addresses and disables the first comparison signals when the reference addresses are not the same as the row addresses, the second comparators respectively enable the second comparison signals when the reference bank addresses are the same as the bank addresses and disables the second comparison signals when the reference bank addresses are not the same as the bank addresses, and the logic circuit enables the masking control signal when the first and second comparison signals and the second control signals are enabled and disables the masking control signal when at least one of the first and second comparison signals and the second control signals is disabled.

According to another embodiment of the present disclosure, a method of masking a predetermined area of a memory cell array in a semiconductor memory device comprises storing a reference address signal in a write protection circuit, comparing the reference address signal stored in the write protection circuit with a row address signal during a write operation, enabling a masking control signal when the row address signal and the reference address signal correspond to a same address, and disabling a plurality of column selection lines of the memory cell array when the masking control signal is enabled.

Storing the reference address signal comprises storing a reference address, and stroing a reference bank address.

Comparing the reference address signal stored in the write protection circuit with a row address signal comprises comparing the reference address with a row address of the row address signal, and comparing the reference bank address with a bank address of the row address signal.

The method comprises enabling first comparison signals upon determining the reference address to be the same as the row address, enabling second comparison signals upon determining the reference bank address to be the same as the bank address, and enabling the masking control signal upon enabling the first comparison signals and the second comparison signals.

The plurality of column selection lines of the memory cell array correspond to column selection lines of the reference address signal. All column selection lines of the memory cell array are disabled when the masking control signal is enabled.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Figure 1:
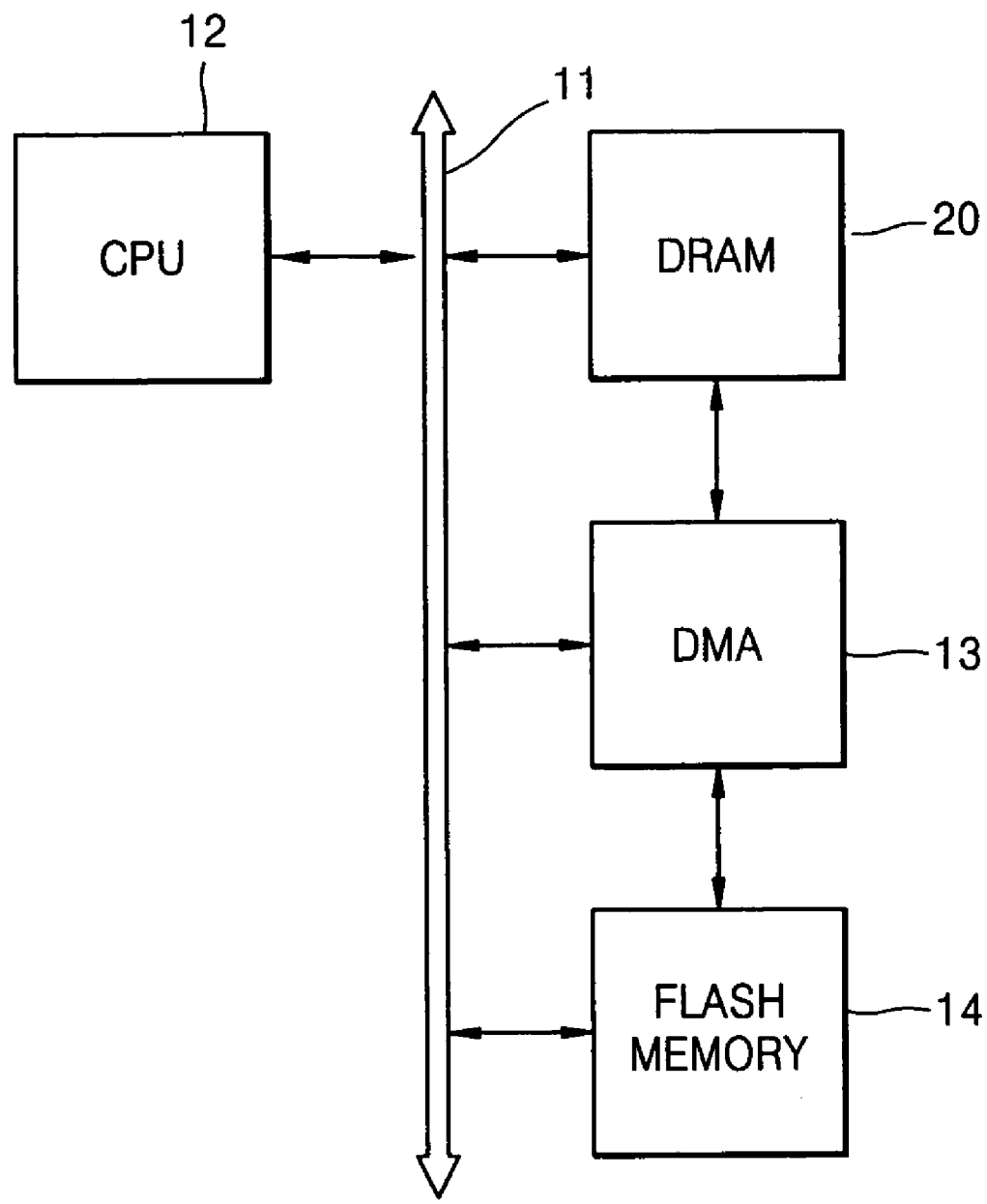
FIG. 1 is a block diagram of a system having a DRAM.
Figure 2:
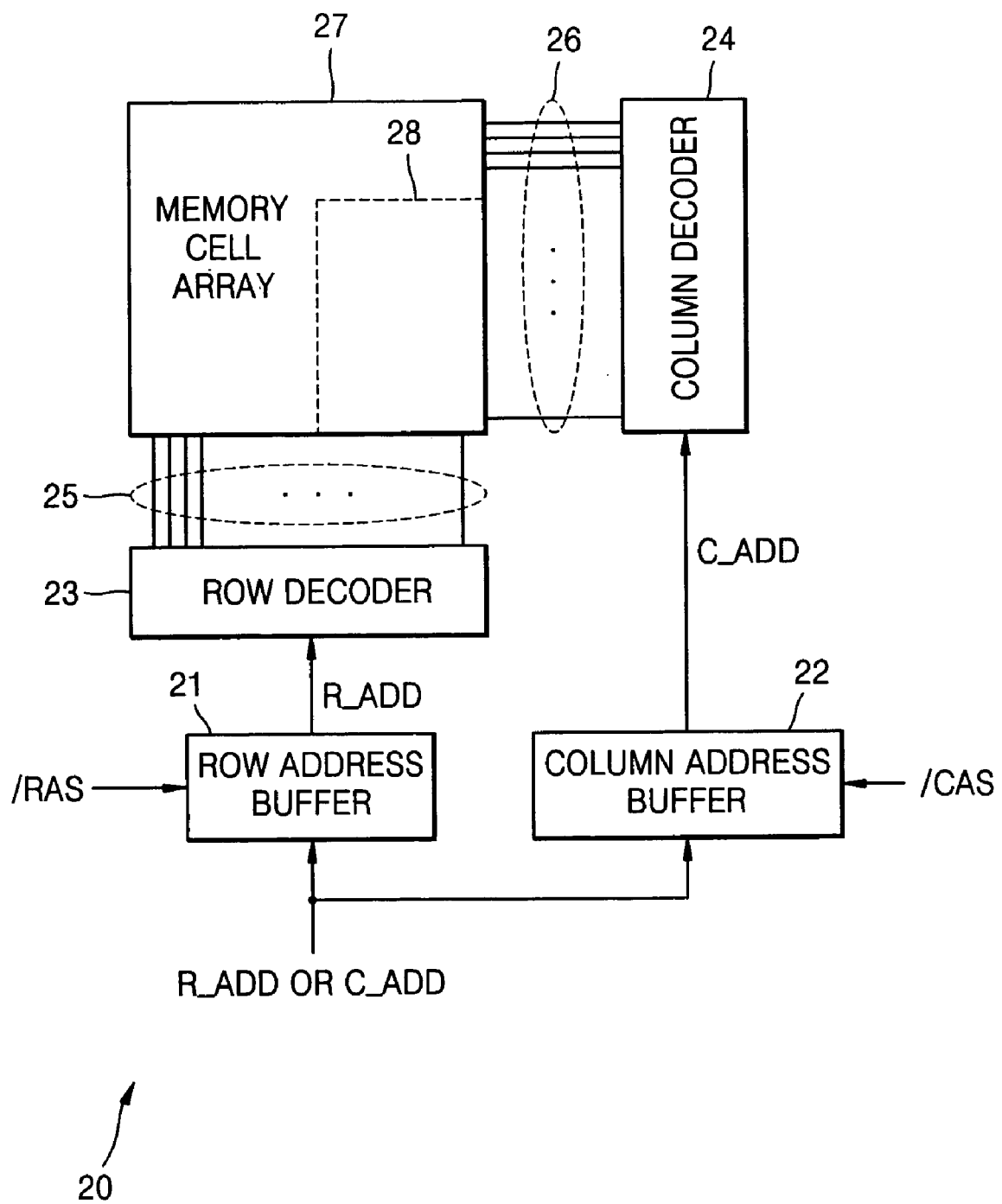
FIG. 2 is a detailed block diagram of the DRAM of FIG. 1.

The present invention will now be described more fully with reference to the accompanying drawings, in which exemplary embodiments of the invention are shown. In the drawings, like reference numerals represent like elements.

Figure 3:
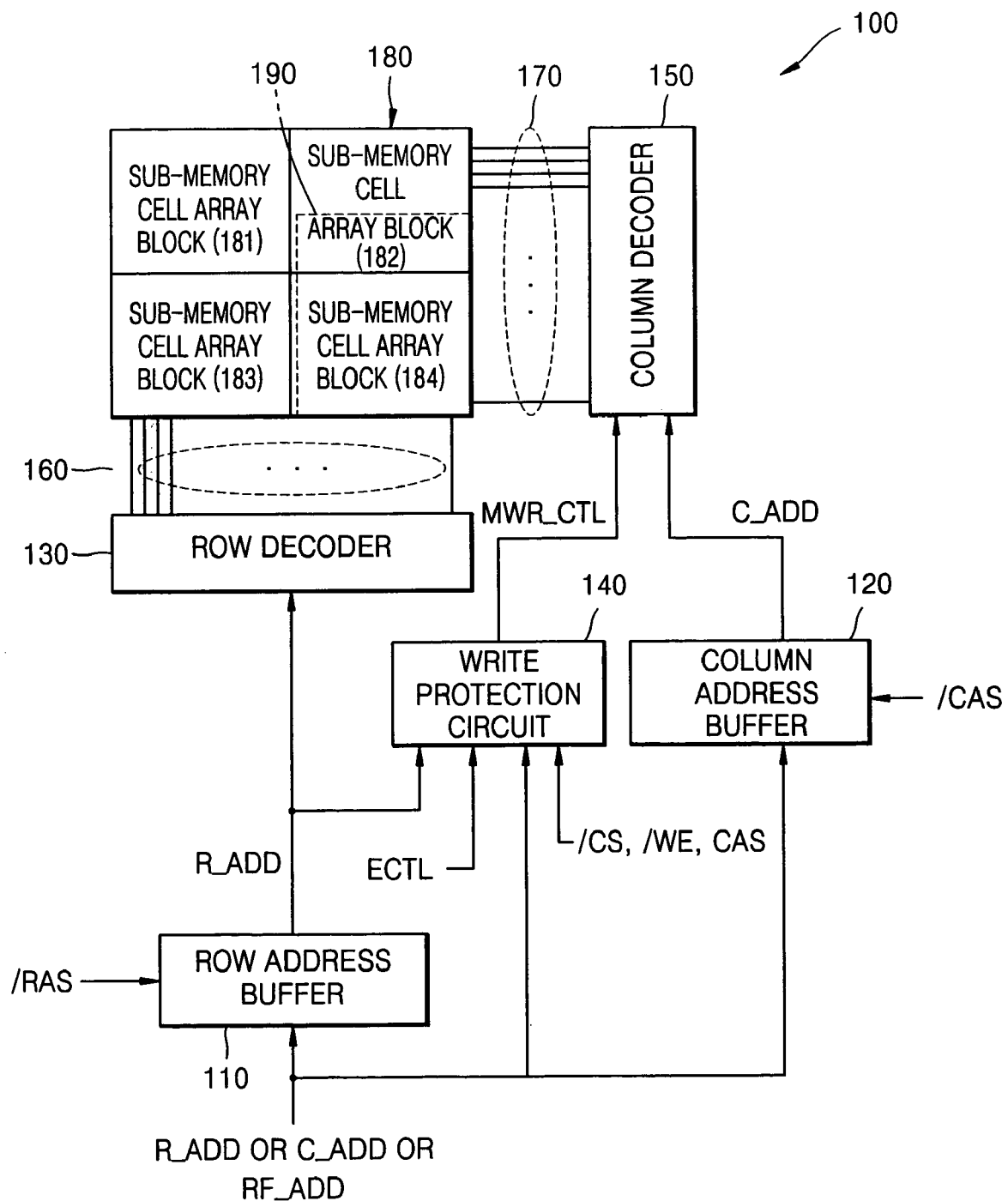
FIG. 3 is a block diagram of a semiconductor memory device according to an exemplary embodiment of the present disclosure.

FIG. 3 is a block diagram of a semiconductor memory device 100 according to an exemplary embodiment of the present disclosure. Referring to FIG. 3, the semiconductor memory device 100 includes a row address buffer 110, a column address buffer 120, a row decoder 130, a write protection circuit 140, a column decoder 150, and a memory cell array 180. The row address buffer 110 outputs a row address signal R_ADD, which has been received via address pins (not shown), to the row decoder 130 in response to a first strobe signal /RAS. The column address buffer 120 outputs a column address signal C_ADD, which has been received via the address pins, to the column decoder 150 in response to a second strobe signal /CAS. The row address signal R_ADD and the column address signal C_ADD may be received from outside the semiconductor memory device 100. The first and second strobe signals /RAS and /CAS are enabled independently of each other, and the row address buffer 110 and the column address buffer 120 operate independently of each other. The row decoder 130 decodes the row address signal R_ADD and activates one or more of a plurality of wordlines 160 corresponding to the decoded row address signal.

The write protection circuit 140 is enabled or disabled in response to a control signal ECTL input from outside the semiconductor memory device 100. When enabled, the write protection circuit 140 outputs a masking control signal MWR_CTL in response to the row address signal R_ADD, the second strobe signal /CAS, a chip selection signal /CS, and a write enable signal /WE input from outside the semiconductor memory device 100. The structure and operation of the write protection circuit 140 will be described later in greater detail with reference to FIG. 4.

The column decoder 150 operates in response to the masking control signal MWR_CTL. When the masking control signal MWR_CTL is disabled, the column decoder 150 decodes the column address signal C_ADD and enables a column selection line of a plurality of column selection lines 170 corresponding to the decoded column address signal. When the masking control signal MWR_CTL is enabled, the column decoder 150 disables the column selection lines 170.

The memory cell array 180 includes sub-memory cell array blocks 181 through 184. Each of the sub-memory cell array blocks 181 through 184 includes a plurality of memory cells. Program data transferred from an external flash memory, for example, the flash memory 14 of FIG. 1, is stored in a predetermined area 190, hereinafter, referred to as a program copy area, of the memory cell array 180. The size of the program copy area 190 may be increased or decreased depending on the needs. For example, the program copy area 190 may account for one of the sub-memory cell array blocks 181 through 184 or a portion of one of the sub-memory cell array blocks 181 through 184. In FIG. 3, the program copy area 190 is illustrated as including the sub-memory cell array block 184 and a portion of the sub-memory cell array block 182.

Figure 4:
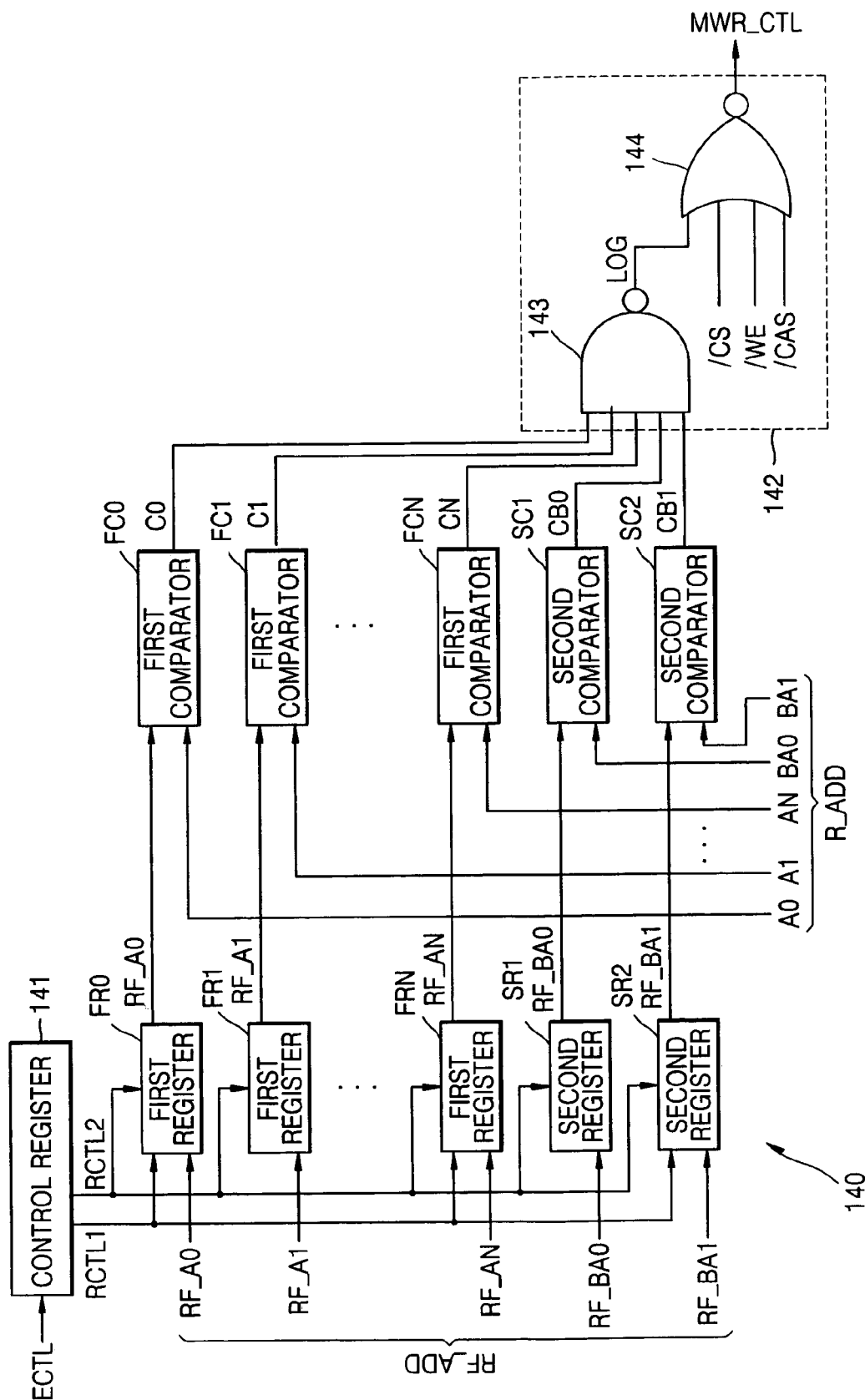
FIG. 4 is a detailed block diagram of a write protection circuit of FIG. 3.

FIG. 4 is a block diagram of the write protection circuit 140 of FIG. 3. Referring to FIG. 4, the write protection circuit 140 includes a control register 141, first registers FR0 through FRN, where N is an integer, second registers SR1 and SR2, first comparators FC0 through FCN, where N is an integer, second comparators SC1 and SC2, and a logic circuit 142. The control register 141 outputs first and second register control signals RCTL1 and RCTL2 in response to the control signal ECTL. The control register 141 is set to a predetermined value in response to the control signal ECTL and enables the first or second register control signal or disables both the first and second register control signals RCTL1 and RCTL2 depending on the predetermined value. For example, if the control signal ECTL contains a first setting value, the control register 141 is set to the first setting value in response to the control signal ECTL and enables the first register control signal RCTL1. If the control signal ECTL contains a second setting value, the control register 141 is set to the second setting value in response to the control signal ECTL and enables the second register control signal RCTL2. If the control signal ECTL contains a third setting value, the control register 141 is set to the third setting value in response to the control signal ECTL and disables both the first and second register control signals RCTL1 and RCTL2. The control signal ECTL may be an extended mode register set (EMRS) signal. The EMRS signal is known to those skilled in the art, and thus its detailed description will be omitted.

The first registers FR0 through FRN and the second registers SR1 and SR2 operate in response to the first and second register control signals RCTL1 and RCTL2. When the first register control signal RCTL1 is enabled, the first registers FR0 through FRN store reference addresses RF_A0 through RF_AN, respectively, of a reference address signal RF_ADD input via the address pins. The second registers SR1 and SR2 store reference bank addresses RF_BA0 and RF_BA1, respectively, of the reference address signal RF_ADD. The reference address signal RF_ADD is an address signal corresponding to the program copy area 190 that needs to be masked during a write operation.

When the second register control signal RCTL2 is enabled, the first registers FR0 through FRN output the reference addresses RF_A0 through RF_AN, respectively, and the second registers SR1 and SR2 output the reference bank addresses RF_BA0 and RF_BA1, respectively.

The first comparators FC0 through FCN compare the reference addresses RF_A0 through RF_AN, respectively, output from the first registers FR0 through FRN, respectively, with row addresses A0 through AN, respectively, of the row address signal R_ADD and output first comparison signals C0 through CN, respectively, as the respective comparison results. When the reference addresses RF_A0 through RF_AN are the same as their respective row addresses A0 through AN, the first comparators FC0 through FCN enable the respective first comparison signals C0 through CN. When the reference addresses RF_A0 through RF_AN are not the same as their respective row addresses A0 through AN, the first comparators FC0 through FCN disable the respective first comparison signals C0 through CN.

The second comparators SC1 and SC2 compare the reference bank addresses RF_BA0 and RF_BA1, respectively, received from the second registers SR1 and SR2, respectively, with bank addresses BA0 and BA1, respectively, of the row address signal R_ADD and output second comparison signals CB0 and CB1, respectively, as the respective comparison results. When the reference bank addresses RF_BA0 and RF_BA1 are the same as their respective bank addresses BA0 and BA1, the second comparators SC1 and SC2 enable the respective second comparison signals CB0 and CB1. When the reference bank addresses RF_BA0 and RF_BA1 are not the same as their respective bank addresses BA0 and BA1, the second comparators SC1 and SC2 disable the respective second comparison signals CB0 and CB1.

A value of each of the bank addresses BA0 and BA1 designates one of the sub-memory cell array blocks 181 through 184 of FIG. 3. For example, if each of the bank addresses BA0 and BA1 has a value of "00", it designates the sub-memory cell array block 181. If each of the bank addresses BA0 and BA1 has a value of "01", it designates the sub-memory cell array block 182. If each of the bank addresses BA0 and BA1 has a value of "10", it designates the sub-memory cell array block 183. If each of the bank addresses BA0 and BA has a value of "11", it designates the sub-memory cell array block 184.

The logic circuit 142 outputs the masking control signal MWR_CTL in response to the first comparison signals C0 through CN, the second comparison signals CB0 and CB1, the second strobe signal /CAS, the chip selection signal /CS, and the write enable signal /WE. The logic circuit 142 includes a NAND gate 143 and a NOR gate 144. The logic circuit 142 may have a different structure from the one depicted in FIG. 4 for outputting the masking control signal MWR_CTL. The NAND gate 143 outputs a logic signal LOG in response to the first comparison signals C0 through CN and the second comparison signals CB0 and CB1. When the first comparison signals C0 through CN and the second comparison signals CB0 and CB1 are all enabled, the NAND gate 143 disables the logic signal LOG. When at least one of the first comparison signals C0 through CN and the second comparison signals CB0 and CB1 is disabled, the NAND gate 143 enables the logic signal LOG.

The NOR gate 144 outputs the masking control signal MWR_CTL in response to the logic signal LOG, the second strobe signal /CAS, the chip selection signal /CS, and the write enable signal /WE. When the logic signal LOG, the second strobe signal /CAS, the chip selection signal /CS, and the write enable signal /WE are all disabled, the NOR gate 144 enables the masking control signal MWR_CTL. When at least one of the logic signal LOG, the second strobe signal /CAS, the chip selection signal /CS, and the write enable signal /WE is enabled, the NOR gate 144 disables the masking control-signal MWR_CTL.

Figure 5:
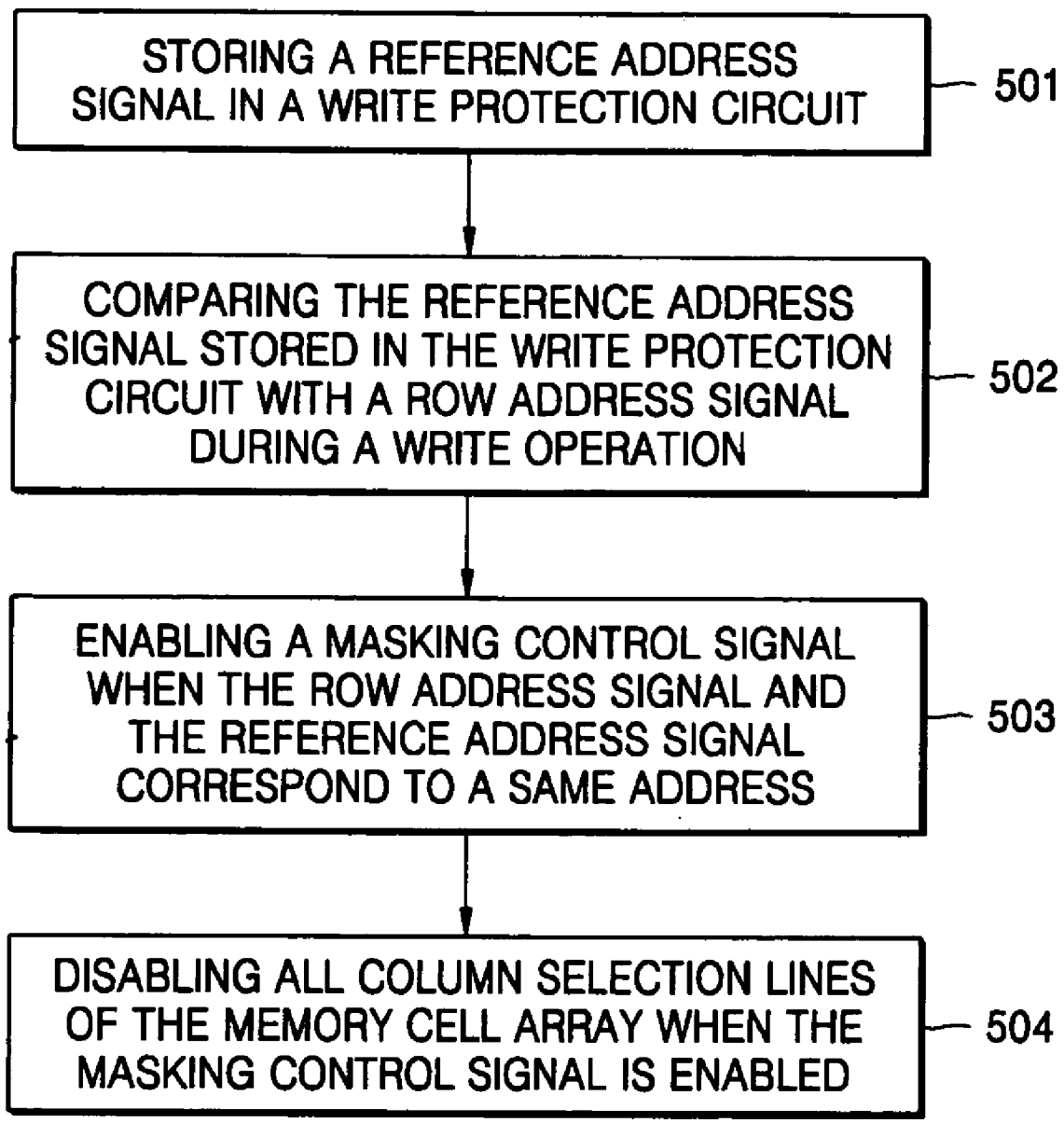
FIG. 5 is a flow chart of a method according to an exemplary embodiment of the present disclosure.

Referring to FIG. 5, a method of masking a predetermined area of a memory cell array in a semiconductor memory device comprises storing a reference address signal in a write protection circuit 501, comparing the reference address signal stored in the write protection circuit with a row address signal during a write operation 502, enabling a masking control signal when the row address signal and the reference address signal correspond to a same address 503, and disabling all column selection lines of the memory cell array when the masking control signal is enabled 504.

A method of masking the program copy area 190 in the semiconductor memory device 100 during a write operation according to an exemplary embodiment of the present disclosure will now be described. When the control register 141 of the write protection circuit 140 receives the control signal ECTL having the first setting value, the control register 141 is set to the first setting value and enables the first register control signal RCTL1. The first registers FR0 through FRN store the reference addresses RF_A0 through RF_AN, respectively, of the reference address signal RF_ADD in response to the first register control signal RCTL1. In addition, the second registers SR1 and SR2 store the reference bank addresses RF_BA0 and RF_BA1, respectively, of the reference address signal RF_ADD in response to the first register control signal RCTL1.

When the control register 141 receives the control signal ECTL having the second setting value, the control register 141 is set to the second setting value and then disables the first register control signal RCTL1 and enables the second register control signal RCTL2. The first registers FR0 through FRN output the reference addresses RF_A0 through RF_AN, respectively, stored therein in response to the second register control signal RCTL2, and the second registers SR1 and SR2 output the reference bank addresses RF_BA0 and RF_BA1, respectively, in response to the second register control signal RCTL2.

The row address buffer 110 receives the row address signal R_ADD via the address pins in response to the first strobe signal /RAS and outputs the row address signal R_ADD. The first comparators FC0 through FCN compares the reference addresses RF_A0 through RF_AN, respectively, received from the first registers FR0 through FRN, respectively, with the row addresses A0 through AN, respectively, of the row address signal R_ADD. When the reference addresses RF_A0 through RF_AN are the same as their respective row addresses A0 through AN, the first comparators FC0 through FCN enable the first comparison signals C0 through CN, respectively.

The second comparators SC1 and SC2 compare the reference bank addresses RF_BA0 and RF_BA1, respectively, received from the second registers SR1 and SR2, respectively, with bank addresses BA0 and BA1, respectively, of the row address signal R_ADD. When the reference bank addresses RF_BA0 and RF_BA1 are the same as their respective bank addresses BA0 and BA1, the second comparators SC1 and SC2 enable the second comparison signals CB0 and CB1, respectively.

When the first comparison signals C0 through CN and the second comparison signals CB0 and CB1 are all enabled, the NAND gate 143 of the logic circuit 142 disables the logic signal LOG. When at least one of the first comparison signals C0 through CN and the second comparison signals CB0 and CB1 is disabled, the NAND gate 143 enables the logic signal LOG. When the logic signal LOG, the second strobe signal /CAS, the chip selection signal /CS, and the write enable signal /WE are disabled, the NOR gate 144 of the logic circuit 142 enables the masking control signal MWR_CTL. Thereafter, the column decoder 150 disables the column selection lines 170 of the memory cell array 180 in response to the masking control signal MWR_CTL. As a result, it is possible to prevent data from being written on a predetermined area of the memory cell array 180 corresponding to the reference address signal RF_ADD, e.g., the program copy area 190, during a write operation.

As described above, according to the present disclosure, it is possible to prevent data from being written on a predetermined area of a memory cell array that needs to be protected during a write operation.

While the present invention has been particularly shown and described with reference to exemplary embodiments thereof, it will be understood by those of ordinary skill in the art that various changes in form and details may be made therein without departing from the spirit and scope of the present disclosure.

What is claimed is:

1. A semiconductor memory device comprising:
   a memory cell array, which comprises a plurality of memory cells, at least one of the plurality of memory cells storing program data received from a memory;
   a row address buffer, which receives a row address signal via an address pin in response to a first strobe signal;
   a column address buffer, which receives a column address signal via the address pin in response to a second strobe signal;
   a write protection circuit, which is enabled or disabled in response to a first control signal, the write protection circuit, when enabled, outputting a masking control signal in response to the row address signal, the second strobe signal, and second control signals; and
   a column decoder, which decodes the column address signal in response to the masking control signal and enables at least one of a plurality of column selection lines of the memory cell array corresponding to the decoded column address signal, or disables the column selection lines of the memory cell array.

2. The semiconductor memory device of claim 1, wherein the write protection circuit stores a reference address signal received via the address pin when it receives the first control signal having a first setting value, and compares the row address signal with the reference address signal stored therein and outputs the masking control signal in response to a comparison result, the second strobe signal, and the second control signals when it receives the first control signal having a second setting value.

3. The semiconductor memory device of claim 2, wherein the write protection circuit enables the masking control signal when the second control signals are enabled and the row address signal and the reference address signal correspond to a same address, and disables the masking control signal when the second control signals are disabled and the row address and the reference address signal correspond to different addresses.

4. The semiconductor memory device of claim 3, wherein the column decoder decodes the column address signal and enables at least one of the column selection lines corresponding to the decoded column address signal when the masking control signal is disabled, and disables all of the column selection lines when the masking control signal is enabled.

5. The semiconductor memory device of claim 1, further comprising:
    a row decoder, which decodes the row address signal and activates at least one of a plurality of wordlines of the memory cell array corresponding to the decoded row address signal,
    wherein the first control signal is an extended mode register set (EMRS) signal.

6. The semiconductor memory device of claim 1, wherein the second control signals are an inverted chip selection signal, and an inverted signal of the chip selection signal and an inverted signal of the write enable signal.

7. The semiconductor memory device of claim 1, wherein the reference address signal comprises reference addresses and reference bank addresses, and the row address signal comprises row addresses and bank addresses.

8. The semiconductor memory device of claim 7, wherein the write protection circuit comprises:
    a control register, which is set to a predetermined value in response to the first control signal and outputs first and second register control signals according to the predetermined value;
    first registers, which respectively store the reference addresses in response to the first register control signal and output the reference addresses in response to the second register control signal;
    second registers, which respectively store the reference bank addresses in response to the first register control signal and output the reference bank addresses in response to the second register control signal;
    first comparators, which respectively compare the reference addresses received from the first registers with the row addresses and output first comparison signals as comparison results;
    second comparators, which respectively compare the reference bank addresses received from the second registers with the bank addresses and output second comparison signals as comparison results; and
    a logic circuit, which outputs the masking control signal in response to the first and second comparison signals and the second control signals.

9. The semiconductor memory device of claim 8, wherein the control register enables the first register control signal when it is set to the first setting value in response to the first control signal, enables the second register control signal when it is set to the second setting value in response to the first control signal, and disables both of the first and second register control signals when it is set to the third setting value in response to the first control signal.

10. The semiconductor memory device of claim 9, wherein the first and second registers are disabled when the first and second register control signals are disabled.

11. The semiconductor memory device of claim 8, wherein the first comparators respectively enable the first comparison signals when the reference addresses are the same as the row addresses and disables the first comparison signals when the reference addresses are not the same as the row addresses,
    the second comparators respectively enable the second comparison signals when the reference bank addresses are the same as the bank addresses and disables the second comparison signals when the reference bank addresses are not the same as the bank addresses, and
    the logic circuit enables the masking control signal when the first and second comparison signals and the second control signals are enabled and disables the masking control signal when at least one of the first and second comparison signals and the second control signals is disabled.

12. A method of masking a predetermined area of a memory cell array in a semiconductor memory device, the method comprising:
    storing a reference address signal in a write protection circuit;
    comparing the reference address signal stored in the write protection circuit with a row address signal during a write operation;
    enabling a masking control signal when the row address signal and the reference address signal correspond to a same address; and
    disabling a plurality of column selection lines of the memory cell array when the masking control signal is enabled.

13. The method of claim 12, wherein storing the reference address signal comprises:
    storing a reference address; and
    storing a reference bank address.

14. The method of claim 13, wherein comparing the reference address signal stored in the write protection circuit with a row address signal comprises:
    comparing the reference address with a row address of the row address signal; and
    comparing the reference bank address with a bank address of the row address signal.

15. The method of claim 14, further comprising:
    enabling first comparison signals upon determining the reference address to be the same as the row address;
    enabling second comparison signals upon determining the reference bank address to be the same as the bank address; and
    enabling the masking control signal upon enabling the first comparison signals and the second comparison signals.

16. The method of claim 12, wherein the plurality of column selection lines of the memory cell array correspond to column selection lines of the reference address signal.

17. The method of claim 12, wherein all column selection lines of the memory cell array are disabled when the masking control signal is enabled.

* * * * *